US012038463B2

(12) United States Patent
Zhou et al.

(10) Patent No.: US 12,038,463 B2
(45) Date of Patent: *Jul. 16, 2024

(54) INTEGRATED IMPEDANCE MEASUREMENT DEVICE AND IMPEDANCE MEASUREMENT METHOD THEREOF

(71) Applicant: Taiwan Semiconductor Manufacturing Company, Ltd., Hsinchu (TW)

(72) Inventors: Haohua Zhou, Fremont, CA (US); Mei Hsu Wong, Saratoga, CA (US); Tze-Chiang Huang, Saratoga, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/359,928

(22) Filed: Jul. 27, 2023

(65) Prior Publication Data

US 2023/0366917 A1 Nov. 16, 2023

Related U.S. Application Data

(63) Continuation of application No. 17/236,010, filed on Apr. 21, 2021, now Pat. No. 11,740,272.
(Continued)

(51) Int. Cl.
*G01R 27/16* (2006.01)
*G01R 31/30* (2006.01)
*G01R 31/319* (2006.01)

(52) U.S. Cl.
CPC .............. *G01R 27/16* (2013.01); *G01R 31/30* (2013.01); *G01R 31/31905* (2013.01)

(58) Field of Classification Search
CPC ..... G01R 27/16; G01R 31/30; G01R 31/31905
See application file for complete search history.

(56) References Cited

U.S. PATENT DOCUMENTS

2004/0078156 A1   4/2004   Kantorovich et al.
2010/0148751 A1   6/2010   Okayasu
(Continued)

FOREIGN PATENT DOCUMENTS

TW         301712        4/1997
TW       200406586       5/2004

OTHER PUBLICATIONS

Chinese Office Action; Application No. 202110586420.2; Dated Dec. 26, 2023.
(Continued)

*Primary Examiner* — Jermele M Hollington
*Assistant Examiner* — Zannatul Ferdous
(74) *Attorney, Agent, or Firm* — Jones Day (57) ABSTRACT

Systems, devices, and methods are described herein for measuring an impedance of a DUT using an integrated impedance measurement device. A system includes a plurality of measurement circuits, a FFT processor, and a controller. The measurement circuits are coupled to the DUTs. Each measurement circuit is configured to generate a clock signal for a respective DUT, detect a voltage of the respective DUT, and generate first voltage related data using the clock signal and the voltage. The FFT processor is coupled to the measurement circuits. The FFT processor is configured to convert the first voltage related data into second voltage related data using a fast Fourier transform for each measurement circuit. The controller is coupled to the measurement circuits and the FFT processor. The controller
(Continued)

is configured to calculate an impedance using the second voltage related data for each measurement circuit and output the impedance to each DUT.

20 Claims, 7 Drawing Sheets

Related U.S. Application Data

(60) Provisional application No. 63/030,949, filed on May 28, 2020.

(56) References Cited

U.S. PATENT DOCUMENTS

| | | | |
|---|---|---|---|
| 2012/0007605 A1* | 1/2012 | Benedikt | G01R 31/3167 |
| | | | 324/612 |
| 2015/0212131 A1 | 7/2015 | Liu | |
| 2016/0308504 A1 | 10/2016 | Korony | |
| 2017/0254844 A1 | 9/2017 | Sestok, IV | |
| 2018/0031627 A1 | 2/2018 | Peng et al. | |
| 2018/0164349 A1 | 6/2018 | Yang et al. | |
| 2018/0180652 A1 | 6/2018 | Sestok, IV et al. | |
| 2018/0330993 A1 | 11/2018 | DeLaCruz et al. | |
| 2020/0271717 A1* | 8/2020 | Nakamura | G01R 31/2834 |
| 2021/0373057 A1* | 12/2021 | Zhou | G01R 31/31905 |

OTHER PUBLICATIONS

Taiwanese Office Action; Application No. 110118426; Dated Jul. 19, 2022.

* cited by examiner

INTEGRATED IMPEDANCE MEASUREMENT DEVICE AND IMPEDANCE MEASUREMENT METHOD THEREOF

CROSS-REFERENCE TO RELATED APPLICATIONS

This application is a continuation application of U.S. patent application Ser. No. 17/236,010, filed Apr. 21, 2021, which claims priority to U.S. Application 63/030,949, filed May 28, 2020, the contents of which is incorporated by reference herein in their entirety.

FIELD

The technology described in this disclosure relates generally to integrated impedance measurement devices for embedded calibration of a device under test.

BACKGROUND

Generally, an integrated circuit (IC) is a circuit in which all or some of the circuit elements are inseparably associated and electrically interconnected so that it is considered to be indivisible. An IC is commonly embodied in a wafer. A System on Chip (SOC) is an integrated circuit (also known as a "chip") that integrates components of a computer or other electronic system. Such components can include a Central Processing Unit (CPU), memory, input/output ports, and/or secondary storage on a single substrate or microchip. It may contain digital, analog, mixed-signal, and often radio frequency signal processing functions, depending on the application. Because they are integrated on a single substrate, SOCs can consume less power and take up less surface area than multi-chip designs with equivalent functionality. As such, SOCs are widely used in the mobile computing (e.g., smart devices) and edge computing markets.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

SOCs are widely used in the mobile computing (e.g., smart devices) and edge computing markets. Various circuits that are integrated into a SOC undergo a series of tests after manufacturing to ensure the chip operates as designed. Impedance is an electrical characteristic that identifies an amount of opposition that a circuit has to a current and/or voltage change. Measuring the impedance of a circuit is one way to characterize whether the circuit is performing as designed. By integrating an impedance measurement device within the SOC, testing of the various circuits and devices of the SOC can be performed internal to the SOC.

Figure 1:
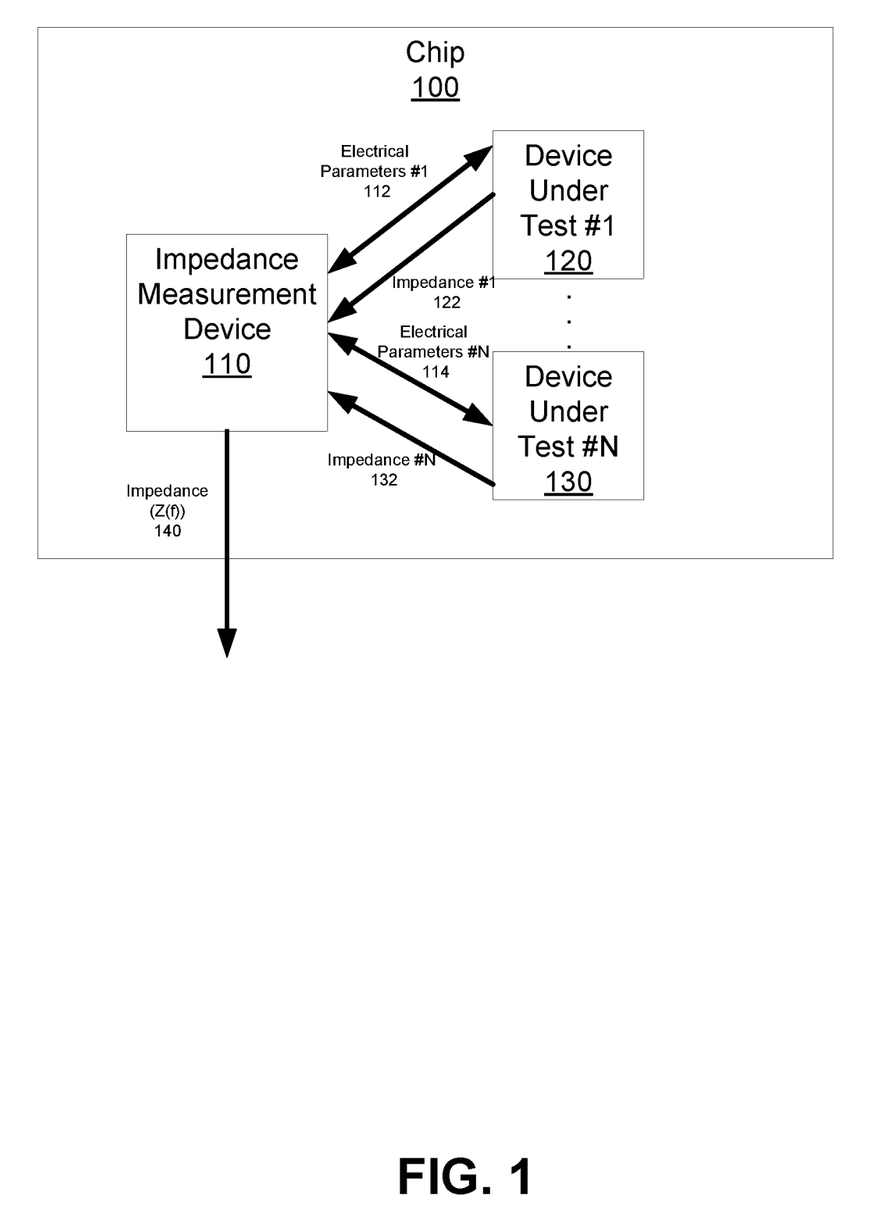
FIG. 1 is a block diagram illustrating an example chip having an integrated impedance measurement device coupled to N number of devices under test in accordance with various embodiments of the present disclosure.

FIG. 1 is a block diagram illustrating an example chip 100 having an integrated impedance measurement device 110 coupled to N number of devices under test (DUTs) (e.g., DUT #1 120 to DUT #N 130) in accordance with various embodiments of the present disclosure. The integrated impedance measurement device 110 is a fully embedded inside system on a chip (SoC) (e.g., SoC 100) which directly outputs an impedance 140, Z(f), for characterization of performance of one or more DUTs 120, 130. This impedance 140, Z(f), is calculated by the impedance measurement device 110 using the electrical parameters 112, 114, and/or impedances 132, 122 measured from one or more DUTs 120, 130. The impedances 122, 132 of the one or more DUTs 120, 130 are determined using electrical parameters 112, 114 through standard electrical calculations (e.g., Z (t)=V(t)/I(t) where Z is the impedance as a function of time, V is voltage as a function of time, and I is current as a function of time) provided to the one or more DUTs 120, 130 by the impedance measurement device 110. Electrical parameters 112, 114 can include embedded currents, I(t), embedded voltages, V(t), and/or clock signals having various frequencies generated by the impedance measurement device 110.

Figure 2:
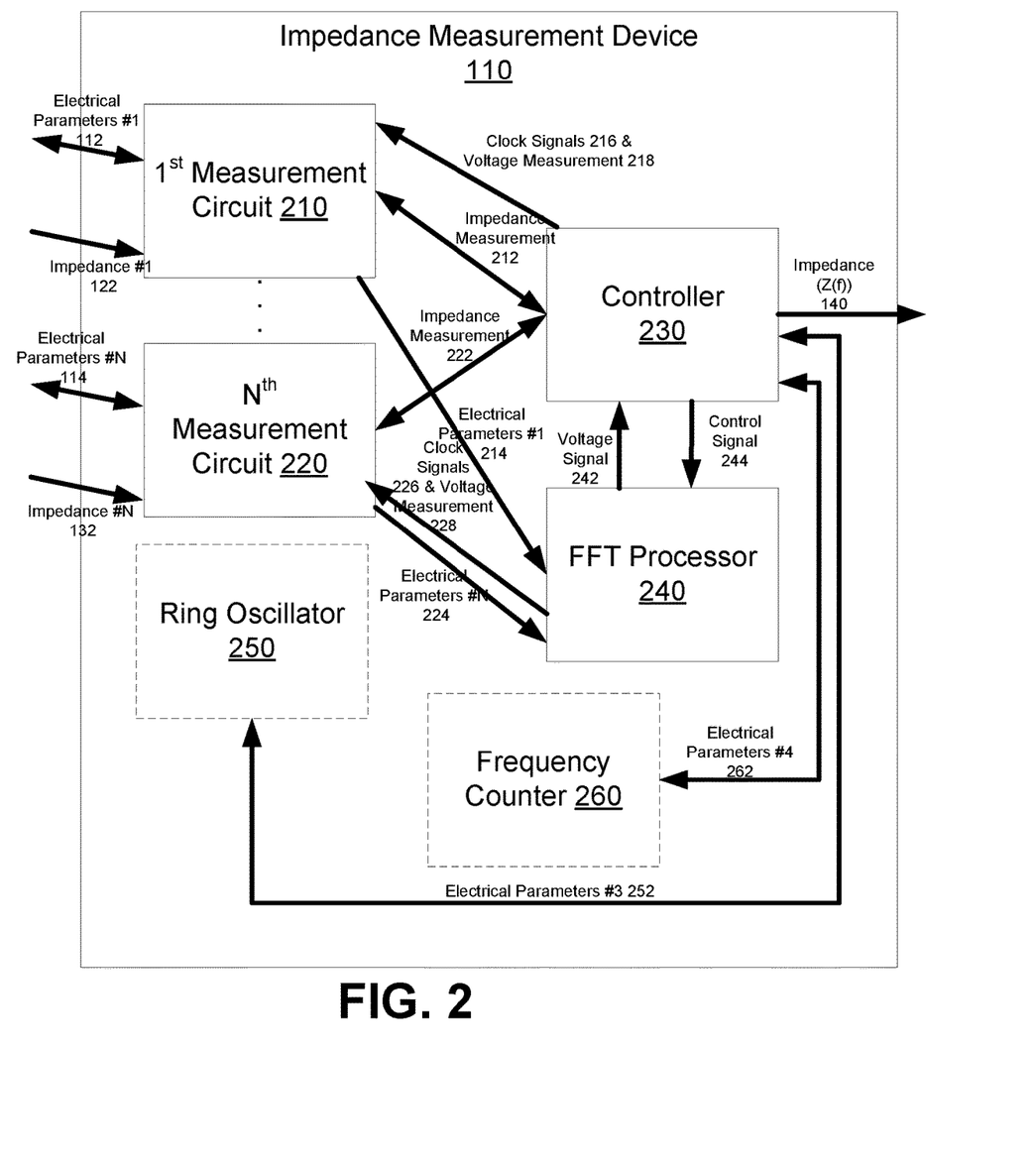
FIG. 2 is a block diagram illustrating an example integrated impedance measurement device in accordance with various embodiments of the present disclosure.

FIG. 2 is a block diagram illustrating an example integrated impedance measurement device 110 in accordance with various embodiments of the present disclosure. The integrated impedance measurement device 110 includes one or more measurement circuits 210, 220 (e.g., 1 to N measurement circuits), a controller 230, and a fast Fourier transform (FFT) processor 240. Each measurement circuit 210, 220 can have a one-to-one correlation with each DUT 120, 130. In other words, one DUT 120, 130 corresponds with one measurement circuit 210, 220. Each measurement circuit 210, 220 generates a clock signal 216, 226 that is provided to its respective DUT 120, 130. In turn each measurement circuit 210, 220 detects a voltage, V(t), 218, 228 of its respective DUT 120, 130. The measurement circuit 210, 220 then generates voltage related data, V(t), (e.g., voltage data expressed as a function of time) using the clock signal generated by each measurement circuit 210, 220 and measured voltage of the respective DUT 120, 130. As described below, each measurement circuit 210, 220 provides its respective impedance measurements 212, 222 to controller 230. The controller 230 calculates an impedance, Z(f), 140 using the second voltage related data (e.g., voltage signal 242) and output the impedance, Z(f), 140 of the respective DUTs 120, 130 for characterization of performance of the respective DUT 120, 130.

The FFT processor 240 is coupled to each measurement circuit 210, 220 and the controller 230. The FFT processor 240 receives the electrical parameters for each DUT 120, 130 that are passed through the respective measurement circuits 210, 220 (e.g., electrical parameters #1 214, electrical parameters #N 224). The FFT processor 240 converts the first voltage related data into second voltage related data (e.g., voltage signal 242) using a fast Fourier transform as described in more detail below.

The controller 230 is coupled to each measurement circuit 210, 220 and the FFT processor 240. Each measurement circuit 210, 220 provides its respective impedance measurements 212, 222 to controller 230. The controller 230 calculates an impedance, Z(f), 140 using the second voltage related data (e.g., voltage signal 242) and output the impedance, Z(f), 140 of the respective DUTs 120, 130 for characterization of performance of the respective DUT 120, 130. These calculations are standard calculations known in the art (e.g., Z(f)=V(f)/I(f), where Z(f) is impedance as a function of frequency, V(f) is voltage as a function of frequency, I(f) is current as a function of frequency).

In some embodiments, the integrated impedance measurement device also includes a ring oscillator 250 and/or a frequency counter 260 each coupled to controller 230. The ring oscillator 250 generates a modified frequency of the signal provided by controller 230. More specifically, the ring oscillator 250 generates multiple frequency signals, each signal at a different frequency. These frequencies facilitate extrapolation of the impedance calculations. Namely, the electrical parameters 112, 114 can be measured once, and the impedance value can be extrapolated to a number of frequency values. Electrical parameters 252 such as frequency and/or voltage are exchanged between the controller 230 and ring oscillator 250.

In other variations, the integrated impedance measurement device includes a frequency counter 260. The frequency counter 260 measures the frequency from the controller 230. Electrical parameters 262 such as frequency and/or voltage are exchanged between the controller 230 and frequency counter 260.

Figure 3:
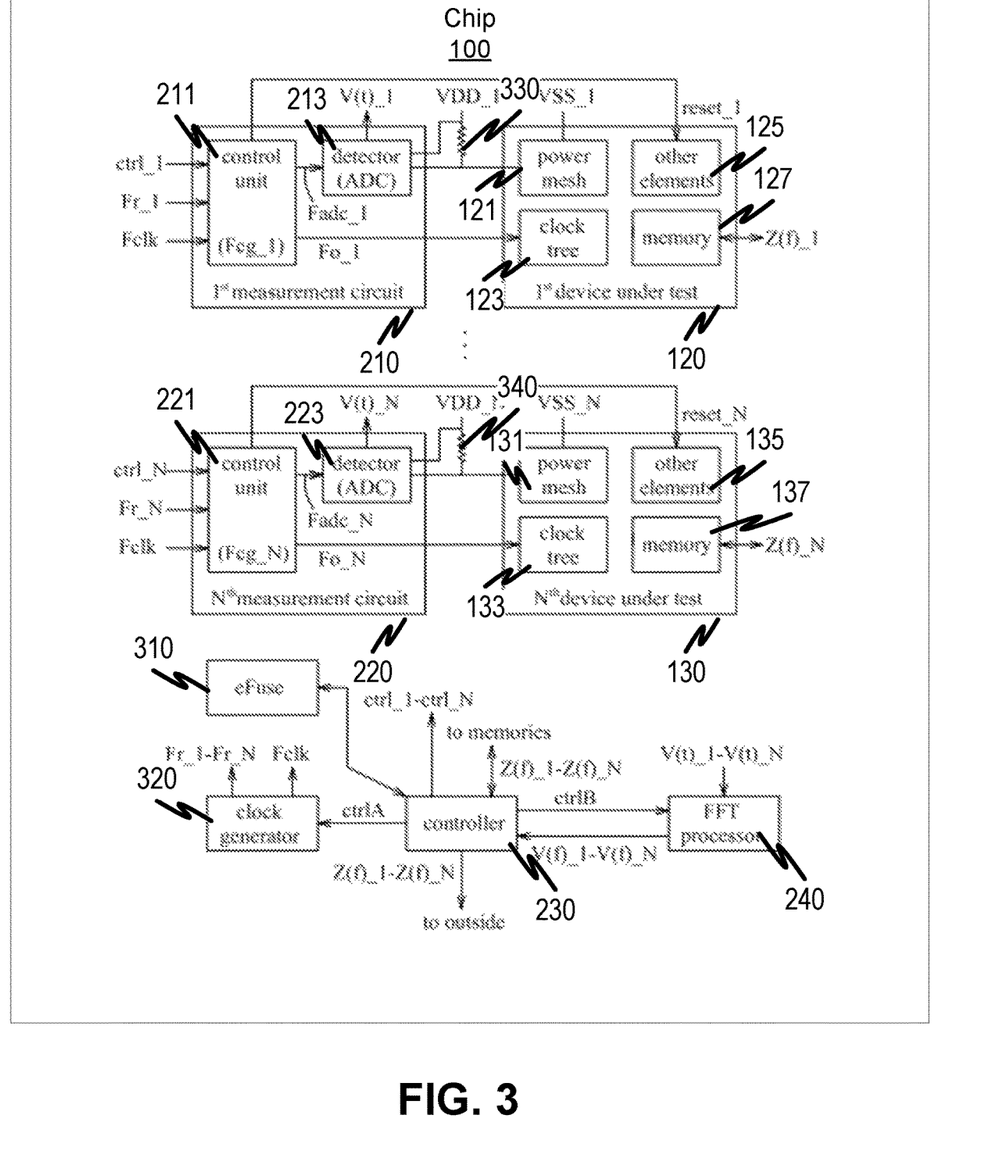
FIG. 3 is another block diagram illustrating an example chip with integrated components of the impedance measurement device in accordance with various embodiments of the present disclosure.

FIG. 3 is another block diagram illustrating an example chip 100 with integrated components of the impedance measurement device 110 in accordance with various embodiments of the present disclosure. The impedance measurement device 110 is integrated in a chip 100 that includes a number (N) of DUTs 120, 130 (e.g., N is greater than or equal to 1). Each DUT 120, 130 includes a power mesh 121, 131, a clock tree 123, 133, a memory 127, 137, and other elements 125, 135. The impedance measurement device 110 includes an eFuse 310, a clock generator 320, a controller 230, an FFT processor 240, and a number (N) of measurement circuits 210, 220. The clock generator 320 generates a number of clock signals (Fclk, Fr_1-Fr_N). The clock generator 320 can be a phase locked loop (PLL) or a ring oscillator known in the art.

Each measurement circuit 210, 220 includes a control unit 211, 221 and a detector 213, 223 such as an analog-to-digital converter (ADC). For each measurement circuit 210, 220, the respective control unit 211, 221 generates a reset signal (e.g., reset_n) using a control signal (e.g., ctrl_n) generated by controller 230. More specifically, when the controller 230 generated a control signal (e.g., ctrl_n), the respective control unit 211, 221 generates that reset signal (e.g., reset_n). This occurs, for example, when a respective DUT 120, 130 needs to enter into a non-function mode. For example, in a non-function mode the DFFs (D flip-flops) are constant (expect only clock tree toggling as the clock tree is normally evenly distributed in the whole chip). The respective control unit 211, 221 also generates clock signals (e.g., Fcg_n, Fo_n, Fadc_n) using the control signal (e.g., ctrl_n) and the clock signals (Fclk, Fr_1-Fr_N) generated by clock generator 320. For example, the generation of the clock signals (e.g., Fcg_n, Fo_n, Fadc_n) is triggered using the presence of the control signal (e.g., ctrl_n). For each DUT 120, 130 and its corresponding measurement circuit 210, 220, a sense resistor 330, 340 is disposed on the VDD path of the respective DUT 120, 130, and the detector 213, 223 of the respective measurement circuit 210, 220 is electrically coupled to the respective power mesh 121, 131 of the respective DUT 120, 130. The sense resistor 330, 340 is electrically coupled between the respective power meshes 121, 131 and the respective detectors 213, 223. The sense resistor 330, 340 measures the current flowing between the respective power meshes 121, 131 and the respective detectors 213, 223. In the embodiment illustrated in FIG. 3, each power mesh 121, 131 is driven by a negative supply voltage, VSS, and each sense resistor 330, 340 is driven by a positive supply voltage, VDD. In other words, each sense resistor 330, 340 is disposed on the positive supply voltage, VDD, path of the corresponding DUT 120, 130.

For each measurement circuit 210, 220, the respective detector 213, 223 operates using the presence of the clock signal (e.g., Fadc_n) generated by control units 211, 221 to convert a voltage at a node of the power mesh 121, 131 of the corresponding DUT 120, 130 into voltage data as a function of time (e.g., V(t)_n) at the frequency rate of the clock signal (e.g., Fadc_n). The FFT processor 240 converts each voltage related data that is a function of time (e.g., V(t)_n) into voltage related data that is a function of frequency (e.g., V(f)_n). More specifically, the FFT processor 240 decomposes an N point (e.g., 16, 32, 64) time domain signal (e.g., V(t)_n) into an N frequency domain signal each having a single point (e.g., V(f)_n). The controller 230 uses these frequency domain signals (e.g., V(f)_n) in combination with the measured current to calculated impedances as a function of frequency (e.g., Z (f)=V (f)/I(f) where Z is the impedance as a function of frequency, V is voltage as a function of frequency, and I is current as a function of frequency). The impedances are extrapolated to a harmonic scale in order to minimize testing time and eliminate the need for multiple electrical parameter measurements. The harmonic scale is calculated using the following equation:

$$\frac{n\pi}{2*Ia*\sin(n\pi d)} \quad (1)$$

where n is the harmonic (e.g., 1, 2, 3, 4, 5), Ia is current (e.g., measured electrical parameters 112, 114), and d is a constant determined by the time domain signal's pulse width, k, divided by the period, T (e.g., d=k/T).

The controller 230 generates the control signals (e.g., ctrl_1-ctrl_N) to control (e.g., start/stop operations) each of the measurement circuits 210, 220 to trigger operation using the control signals (e.g., ctrl_1-ctrl_N). The controller 230 also generates the control signal (e.g., ctrlA) to control the clock generator 320 (e.g., start/stop operations). The controller 230 also generates the control signal (e.g., ctrlB) to control the FFT processor 240. For each DUT 120, 130, the controller 230 calculates an impedance (e.g., Z(f)_n) using the voltage data (e.g., V(f)_n) and predetermined current data. The impedance calculation is known in the art (e.g., Z (t)=V(t)/I(t) where Z is the impedance as a function of time, V is voltage as a function of time, and I is current as a function of time). This predetermine current data is determined using data stored in the eFuse 310 and a duty ratio of the control signal (e.g., Fcg_n) of each control unit 211, 221. The controller 230 stores the impedance (e.g., Z(f)_n) in the memory 127, 137 of the respective DUT 120, 130. The controller 230 outputs the impedance (e.g., Z(f)_n) stored in the memory of the DUT external to the chip 100 (e.g., to outside) for characterization of the performance of the one or more DUTs 120, 130.

Figure 4:
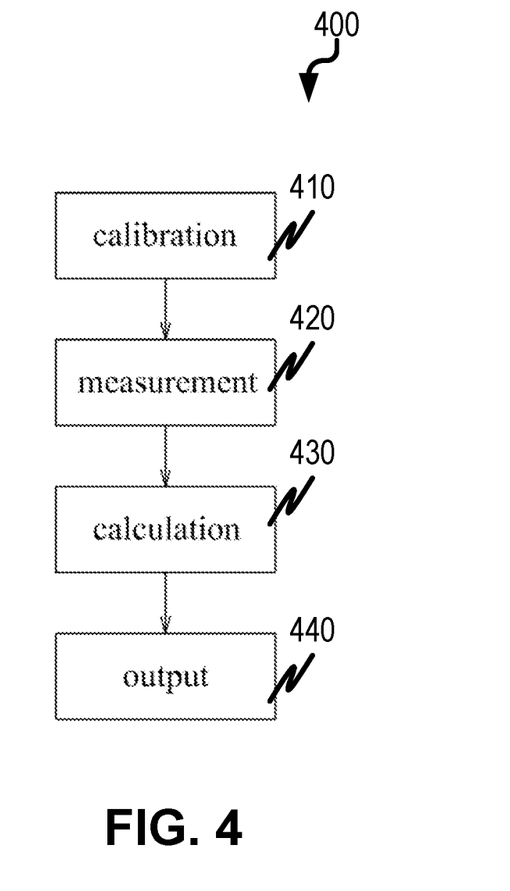
FIG. 4 is an exemplary flow chart illustrating a method of determining impedance of a DUT using an impedance measurement device integrated embedded within a chip in accordance with various embodiments of the present disclosure.

FIG. 4 is an exemplary flow chart 400 illustrating a method of determining impedance of a DUT using an impedance measurement device integrated embedded within a chip in accordance with various embodiments of the present disclosure. The impedance measurement device 110 is calibrated at step 410. In a first embodiment, the calibration 410 includes the steps described in this paragraph. Through the control signals (ctrlA, ctrlB, ctrl_n), the controller 230 sets the frequencies of the clock signals (Fr_n, Fclk, Fcg_n, Fadc_n), the duty ratio of the clock signal (Fcg_n), and the number of the data points of the FFT processor 240, which are in turn used to drive operations (e.g., start/stop operations) of the control unit 211, 221. The different clock frequencies are used to interpolate impedance values without making multiple electrical measurements such as voltage measurements and current measurements at each frequency. Instead, the FFT processor 240 calculates the impedances for each individual clock frequency (Fr_n, Fclk, Fcg_n, Fadc_n). In an example, the frequencies of the clock signals (Fr_n, Fclk, Fcg_n, Fadc_n) are respectively f1, f2, f3 and p×f3, the duty ratio of the clock signal (Fcg_n) is ½, and the number of the data points of the FFT is p, where f1<f3<f2, and p is a positive integer. Through the reset signal (reset_n), the controller 230 causes the respective DUT 120, 130 to enter a non-function mode. For example, the non-function mode is a reset mode, in which all DFFs (D flip-flops) are constant (expect only clock tree toggling as the clock tree is normally evenly distributed in the whole chip). Through the control signal (ctrl_n), the controller 230 causes the measurement circuit 210, 220 to output the clock signal (Fr_n) to serve as the clock signal (Fo_n) by triggering operation of the control unit 211, 221. The controller 230 calculates a constant first current value (I1) using the voltage data (V(f)_n) and the resistance of the sense resistor 330, 340. The first current value (I1) is the current offset (e.g., the difference between the current measured by the sense resistor 330, 340 and the voltage data (V(f)_n). In the example, the amplitude of the voltage data (V(f)_n) at the frequency of f1 is used. Through the control signal (ctrl_n), the controller 230 operates and in turn causes the measurement circuit 210, 220 to output the clock signal (Fclk) to serve as the clock signal (Fo_n). The controller 230 calculates a constant second current value (I2) using the voltage data (V(f)_n) and the resistance of the sense resistor 330, 340. In the example, the amplitude of the voltage data (V(f)_n) at the frequency of f2 is used. Through the control signal (ctrl_n), the controller 230 operates and in turn causes the impedance measurement device to use the clock signal (Fcg_n) to gate the clock signal (Fclk) so as to generate the clock signal (Fo_n). The controller 230 calculates a first impedance (Z1) using the voltage data (V(f)_n) and the current amplitude (Ia). In the example, the first impedance (Z1)=the amplitude of the third harmonic of the voltage data (V(f)_n)/the current amplitude (Ia). Through the control signal (ctrl_n), the controller 230 sets the frequencies of the clock signals (Fcg_n, Fadc_n) to other values, and causes the measurement circuit 210, 220 to use the clock signal (Fcg_n) to gate the clock signal (Fclk) so as to generate the clock signal (Fo_n). In the example, the frequencies of the clock signals (Fcg_n, Fadc_n) are respectively 3×f3 and 3×p×f3. The controller 230 calculates a second impedance (Z2) using the voltage data (V(f)_n) and the current amplitude (Ia). In the example, the second impedance (Z2)=the amplitude of the first harmonic of the voltage data (V(f)_n)/ the current amplitude (Ia). The controller 230 determines whether the settings in A1 are appropriate using the first and second impedances (Z1, Z2). In the example, the determination is affirmative if Z2/Z1≈4. The selection of the use of these two impedances (e.g., Z1 and Z2) is arbitrary and selected for the purposes of ease of explanation. Any impedance values can be utilized to confirm the calculations. A calculated ratio of approximately 1 indicates that the interpolated data is accurate. If the determination in A12 is affirmative, the controller 230 stores the current amplitude (Ia) and the settings in the eFuse 310. If the determination in A12 is negative, the calibration is repeated to change the settings (e.g., the frequencies of the clock signals (Fr_n, Fclk, Fcg_n, Fadc_n)).

In a second embodiment, the calibration 410 includes the steps described in this paragraph. Through the control signals (ctrlA, ctrlB, ctrl_n), the controller 230 sets the frequencies of the clock signals (Fr_n, Fclk, Fcg_n, Fadc_n), the duty ratio of the clock signal (Fcg_n) and the number of the data points of the FFT processor 240. The different clock frequencies are used to interpolate impedance values without making multiple electrical measurements such as voltage measurements and current measurements at each frequency. In an example, the frequencies of the clock signals (Fr_n, Fclk, Fcg_n, Fadc_n) are respectively f1, f2, f3 and p×f3, the duty ratio of the clock signal (Fcg_n) is ½, and the number of the data points of the FFT is p, where f1<f3<f2, and p is a positive integer. Through the reset signal (reset_n), the controller 230 causes the respective DUT 120, 130 to enter a non-function mode. For example, the non-function mode is a reset mode, in which all DFFs (D flip-flops) are constant (expect only clock tree toggling as the clock tree is normally evenly distributed in the whole chip). Through the control signal (ctrl_n), the controller 230 causes the measurement circuit 210, 220 to output the clock signal (Fr_n) to serve as the clock signal (Fo_n). The controller 230 calculates a constant first current value (I1) using the voltage data (V(f)_n) and the resistance of the sense resistor 330, 340. The first current value (I1) is the average current. In the example, the amplitude of the voltage data (V(f)_n) at the frequency of f1 is used. Through the control signal (ctrl_n), the controller 230 causes the measurement circuit 210, 220 to output the clock signal (Fclk) to serve as the clock signal (Fo_n). The controller 230 calculates a constant second current value (I2) using the voltage data (V(f)_n) and the resistance of the sense resistor 330, 340. In the example, the amplitude of the voltage data (V(f)_n) at the frequency of f2 is used. Through the control signal (ctrl_n), the controller 230 operates and in turn causes the impedance measurement device to use the clock signal (Fcg_n) to gate the clock signal (Fclk) so as to generate the clock signal (Fo_n). The different clock frequencies are used to interpolate impedance values without making multiple electrical measurements such as voltage measurements and current measurements at each frequency. The controller 230 calculates a first impedance (Z1) using the voltage data (V(f)_n) and the current amplitude (Ia). In the example, the first impedance (Z1)=the amplitude of the third harmonic of the voltage data (V(f)_n)/the current amplitude (Ia). The selection of the third harmonic is arbitrary and selected for the purposes of ease of explanation. Any harmonic can be utilized to confirm the calculations. Through the control signal (ctrl_n), the controller 230 sets the duty ratio of the clock signal (Fcg_n) to another value, and causes the measurement circuit 210, 220 to use the clock signal (Fcg_n) to gate the clock signal (Fclk) so as to generate the clock signal (Fo_n). The different clock frequencies are used to interpolate impedance values without making multiple electrical measurements such as voltage measurements and current measurements at each frequency. In the example, the duty ratio of the clock signal (Fcg_n) is ⅓. The controller 230 calculates a second impedance (Z2) using the voltage data (V(f)_n) and the current amplitude (Ia). In the example, the second impedance (Z2)= the amplitude of the first harmonic of the voltage data (V(f)_n)/the current amplitude (Ia). The selection of the first harmonic is arbitrary and selected for the purposes of ease of explanation. Any harmonic can be utilized to confirm the calculations. The controller 230 determines whether the settings in A1 are appropriate using the first and second impedances (Z1, Z2). In the example, the determination is affirmative if Z11/Z12≈1.16 (i.e., 0.64/0.55). The selection of the use of these two impedances (e.g., Z11 and Z12) is arbitrary and selected for the purposes of ease of explanation. Any impedance values can be utilized to confirm the calculations. A calculated ratio of approximately 1 indicates that the interpolated data is accurate. If the determination in A12 is affirmative, the controller 230 stores the current amplitude (Ia) and the settings in the eFuse 310.

Once the impedance measurement device 110 is calibrated, it is ready for measurement of voltages and currents, at step 420, which in turn are used to calculate an impedance (e.g., Z(f)=V(f)/I(f), where Z(f) is impedance as a function of frequency, V(f) is voltage as a function of frequency, I(f) is current as a function of frequency). During measurement 420, the controller 230 sweeps the clock signal (Fcg_n) in a predetermined duty ratio and a predetermined frequency range. In the example, the duty ratio is ½, and the frequency range is from 1 MHz to 500 MHz.

Once the impedance measurement device performs measurements 420, the controller 230 calculates at step 430, the impedance (Z(f)_n) over frequency (e.g., Z(f)=V(f)/I(f), where Z(f) is impedance as a function of frequency, V(f) is voltage as a function of frequency, I(f) is current as a function of frequency), and stores the impedance (Z(f)_n) in the memory of the DUT 120, 130. In the output step 440, the controller 230 outputs the impedance (Z(f)_n) stored in the memory of the DUT 120, 130 to outside.

The controller 230 calculates a current amplitude (Ia) that is equal to I2-I1. Ia should be kept to a reasonable value (e.g., within predetermined range specifications of the electrical components within the impedance measurement device 110). Ia affects accuracy when it is too small, and can be out of range when it is too big.

Through the control signal (ctrl_n), the controller 230 operates and in turn causes the impedance measurement device 110 to use the clock signal (Fcg_n) to gate the clock signal (Fclk) so as to generate the clock signal (Fo_n).

Current measurement can be performed once on one typical die, and the current data thus obtained is stored in the eFuse 310. The harmonics can be determined using the current data stored in the eFuse 310, through use of Equation (1), the duty ratio of the clock signal (Fcg_n) (used to scale the current data stored in the eFuse 310, like tables and B11 on page 18), and the PVT variation monitored inside the chip, thereby speeding up the test. The test is sped up as minimal electrical measurements are made (e.g., one measurement of voltage and current) and the FFT processor 240 and controller 230 generate harmonics using Equation (1).

Figure 5:
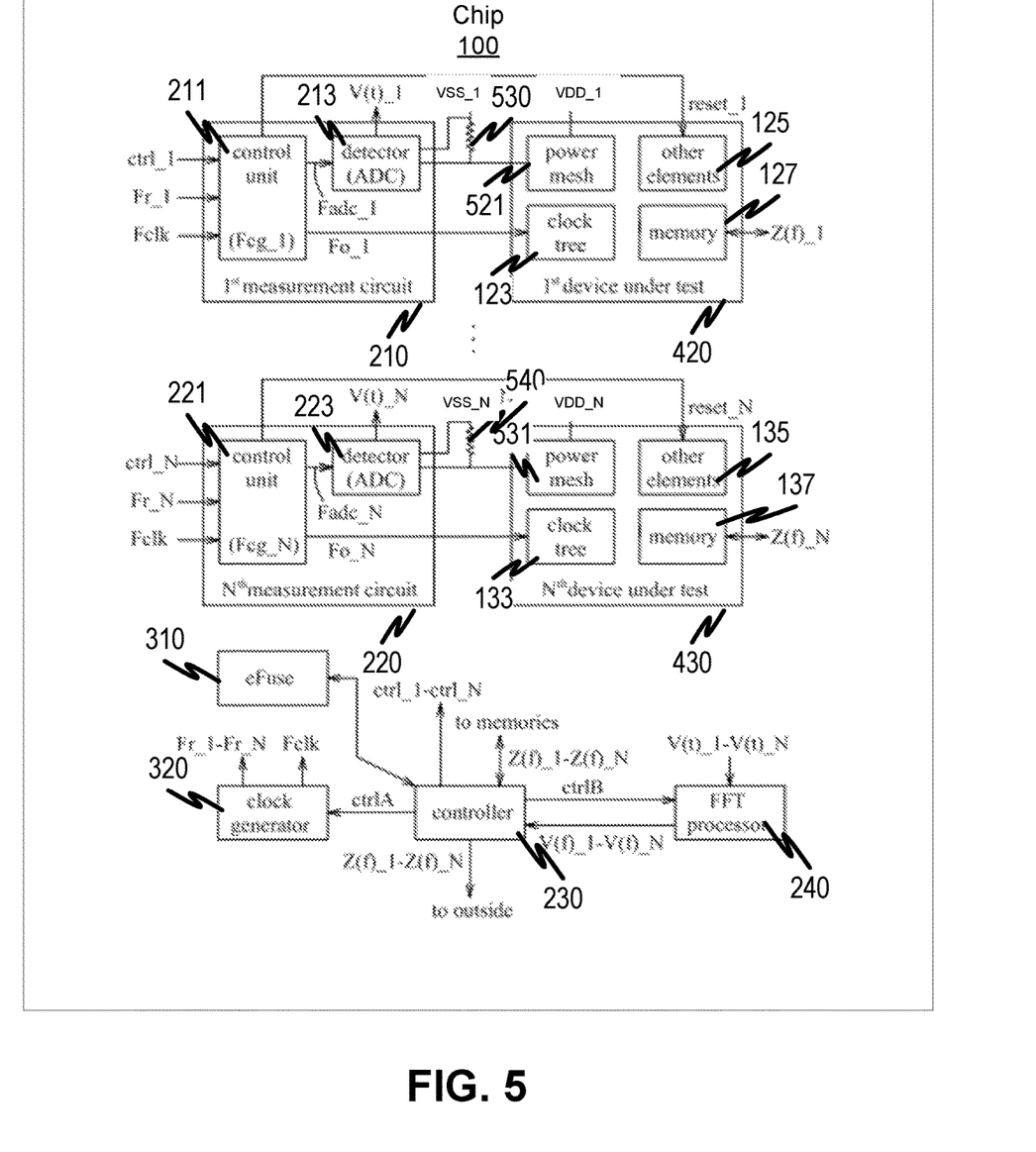
FIG. 5 is a block diagram illustrating another example chip with integrated components of the impedance measurement device in accordance with various embodiments of the present disclosure.

FIG. 5 is a block diagram illustrating another example chip 100 with integrated components of the impedance measurement device 110 in accordance with various embodiments of the present disclosure. In the embodiment illustrated in FIG. 5, each power mesh 521, 531 is driven by a positive supply voltage, VDD, and each sense resistor 530, 540 is driven by a negative supply voltage, VSS. In other words, each sense resistor 530, 540 is disposed on the negative supply voltage, VSS, path of the corresponding DUT 520, 530. This is in contrast to sense resistors 330, 340 described in FIG. 3, where each power mesh 121, 131 is driven by a negative supply voltage, VSS, and each sense resistor 330, 340 is driven by a positive supply voltage, VDD. In other words, each sense resistor 330, 340 is disposed on the positive supply voltage, VDD, path of the corresponding DUT 120, 130. All other components in this embodiment are the same as those previously described in FIG. 3. There is no functional difference between the embodiment of FIG. 3 and the embodiment of FIG. 5.

Figure 6:
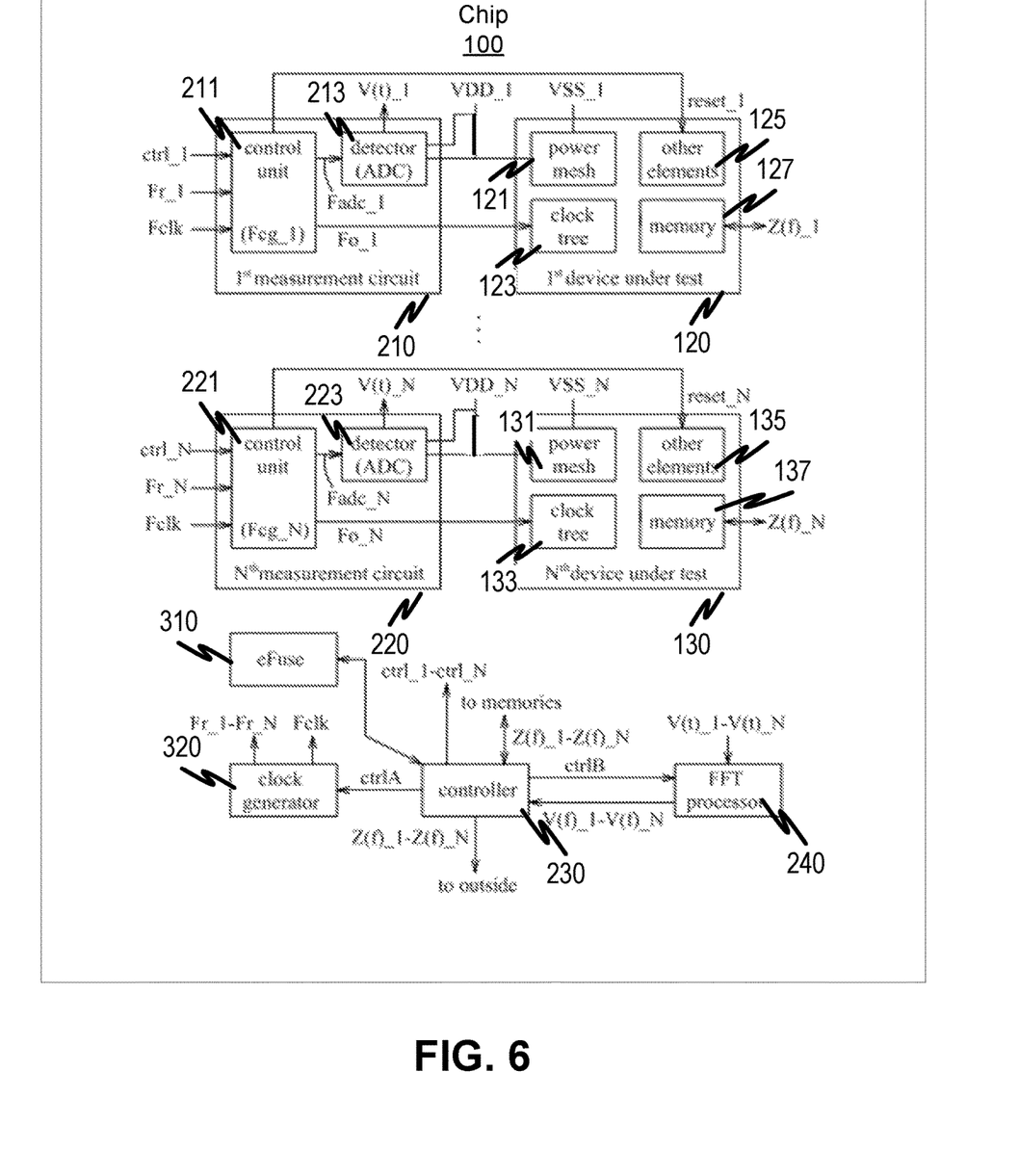
FIG. 6 is a block diagram illustrating another example chip with integrated components of the impedance measurement device in accordance with various embodiments of the present disclosure.

FIG. 6 is a block diagram illustrating another example chip 100 with integrated components of the impedance measurement device 110 in accordance with various embodiments of the present disclosure. In the embodiment illustrated in FIG. 6, the sense resistors (e.g., sense resistors 330, 340) are omitted, and the current amplitude (Ia) is obtained from measurement by a current meter of a power supply (not shown) that provides the voltage (VDD_n). This is in contrast to sense resistors 330, 340 described in FIG. 3, where each power mesh 121, 131 is driven by a negative supply voltage, VSS, and each sense resistor 330, 340 is driven by a positive supply voltage, VDD. In other words, each sense resistor 330, 340 is disposed on the positive supply voltage, VDD, path of the corresponding DUT 120, 130. All other components in this embodiment are the same as those previously described in FIG. 3. There is no functional difference between the embodiment of FIG. 3 and the embodiment of FIG. 6.

Figure 7:
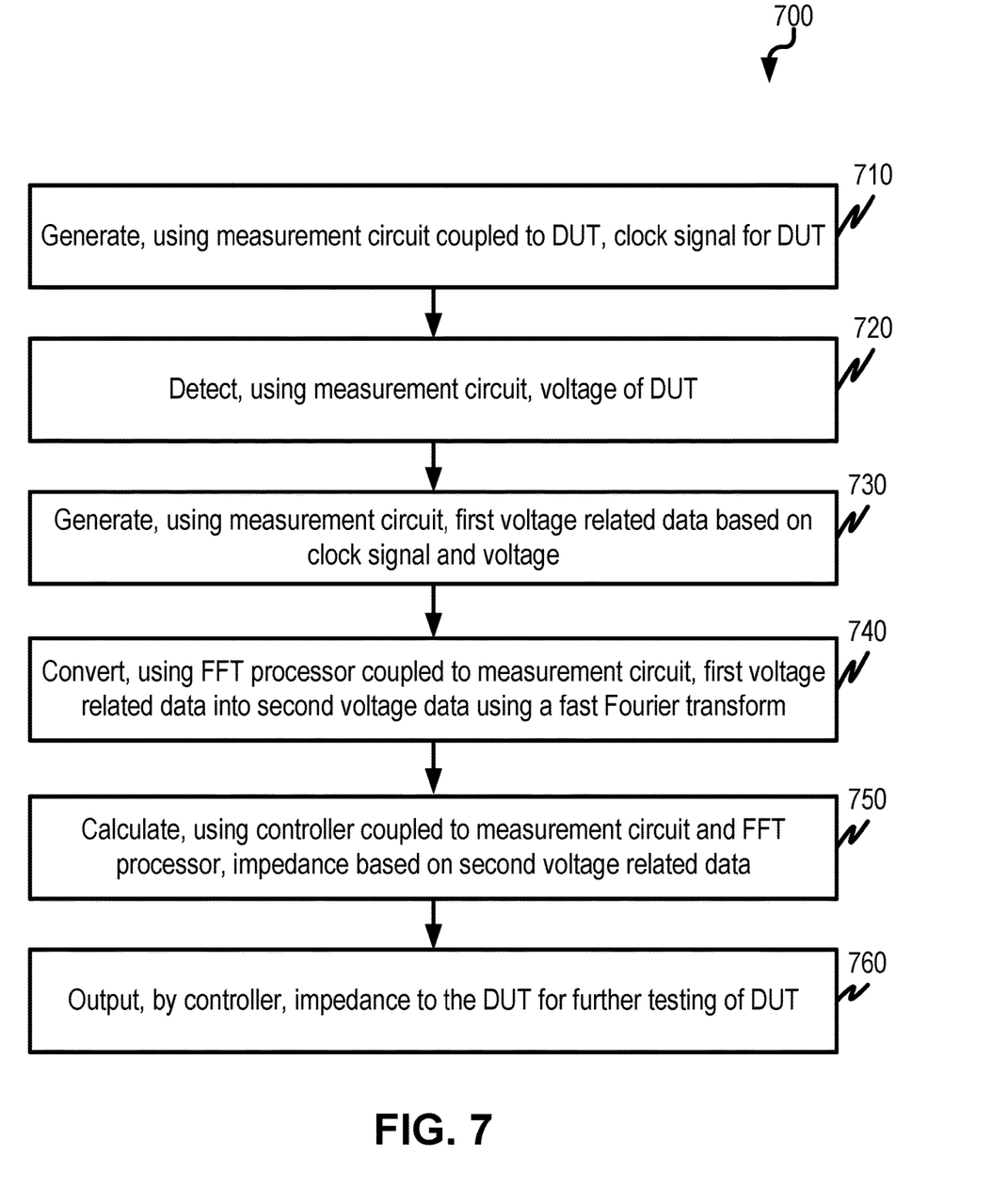
FIG. 7 is an exemplary flow chart illustrating a method of determining impedance of a DUT using an impedance measurement device integrated embedded within a chip in accordance with various embodiments of the present disclosure.

FIG. 7 is an exemplary flow chart 700 illustrating a method of determining impedance of a DUT using an impedance measurement device integrated embedded within a chip in accordance with various embodiments of the present disclosure. While FIG. 7 is described here with reference to previously described structures for ease in understanding, it is understood that the method applies to many other structures as well. A clock signal for the DUT is generated, at 710, using a measurement circuit coupled to the DUT. A voltage of the DUT is detected, at 720, using the measurement circuit. The measurement circuit reveals, at 730, first voltage related data using the clock signal and the voltage. The FFT processor coupled to the measurement circuit converts, at 740, the first voltage related data (e.g., voltage as a function of time) into second voltage related data (e.g., voltage as a function of frequency) using a fast Fourier transform. A controller coupled to the measurement circuit and the FFT processor calculates, at 750, an impedance using the second voltage related data. The controller outputs, at 760, the impedance to the DUT for further testing of the DUT.

Use of the various circuits and methods as described herein can provide a number of advantages. For example, the impedance measurement device described herein enables automatic control of the calibration and/or impedance measurement of one or more DUTs as the impedances at multiple nodes can be measured at the same time, the impedance measurement is fast, and screening for product performance (e.g., evaluating the impedances at different harmonics) can occur internally to the SoC. Additionally, since external probing is not needed for impedance testing, the impedance measurements taken by the impedance measurement device described herein can be measured to the sub-mohm range. Similarly, such measurements can detect high frequency impedances. The impedance measurement device described herein can be integrated with minimal chip overhead, namely because of the memories of the DUTs can be used to store the measured impedance so as to save area. Lastly, since the embedded current, I(t), has a repeated waveform and design of the analog-to-digital converters (ADCs) is non-strict (relaxed).

In one embodiment, a system for determining impedances of a plurality of DUTs include a plurality of measurement circuits, a FFT processor, and a controller. The plurality of measurement circuits are coupled to the plurality of DUTs. Each measurement circuit is configured to generate a clock signal for a respective DUT, detect a voltage of the respective DUT, and generate first voltage related data using the clock signal and the voltage. The FFT processor is coupled to the plurality of measurement circuits. The FFT processor is configured to convert the first voltage related data into second voltage related data using a fast Fourier transform for each measurement circuit. The controller is coupled to the plurality of measurement circuits and the FFT processor. The controller is configured to calculate an impedance using the second voltage related data for each measurement circuit and output the impedance to each DUT.

In another embodiment, an impedance measurement device integrated embedded within a chip includes a measurement circuit, a FFT processor, and a controller. The measurement circuit coupled is coupled to a DUT. The measurement circuit is configured to generate first voltage related data using a clock signal of the DUT and a voltage of the DUT. The FFT processor is coupled to the measurement circuit. The FFT processor is configured to convert the first voltage related data into second voltage related data using a fast Fourier transform. The controller is coupled to the measurement circuit and the FFT processor. The controller is configured to calculate an impedance using the second voltage related data and output the impedance to the DUT.

In yet another embodiment, a method for determining impedance of a DUT using an impedance measurement device integrated embedded within a chip includes generating, using a measurement circuit coupled to the DUT, a clock signal for the DUT. The measurement circuit detects a voltage of the DUT. The measurement circuit generates first voltage related data using the clock signal and the voltage. An FFT processor coupled to the measurement circuit converts the first voltage related data into second voltage related data using a fast Fourier transform. A controller coupled to the measurement circuit and the FFT processor calculates an impedance using the second voltage related data. The controller outputs the impedance to the DUT for further testing of the DUT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for determining impedances of a plurality of devices under test (DUT), the system comprising:
    a plurality of measurement circuits coupled to the plurality of DUTs, wherein the plurality of DUTs comprise electrical circuits, wherein each measurement circuit is configured to generate first voltage related data of a respective DUT;
    a fast Fourier transform (FFT) processor coupled to the plurality of measurement circuits, wherein the FFT processor is configured to convert each first voltage related data into a respective second voltage related data using a fast Fourier transform; and
    a controller coupled to the plurality of measurement circuits and the FFT processor, wherein the controller is configured to calculate an impedance of each DUT using the respective second voltage related data and output each impedance calculated thereby for characterization of performance of the electrical circuits within the plurality of DUTs.

2. The system of claim 1, wherein each DUT comprises a power mesh configured to be controlled by the first voltage related data and a clock tree configured to be controlled by a frequency of a clock signal generated by each measurement circuit.

3. The system of claim 2, wherein the FFT processor is further configured to convert each first current related data that corresponds to current of the power mesh of the respective DUT into a respective second current related data.

4. The system of claim 3, wherein the controller is further configured to calculate a current amplitude using the second current related data.

5. The system of claim 2, wherein each measurement circuit is configured to detect a voltage of the power mesh of the respective DUT.

6. The system of claim 1, wherein the controller is further configured to control the measurement circuit such that a frequency of a clock signal generated by each measurement circuit is equal to a first frequency value and a second frequency value at different times, the second frequency value being greater than the first frequency value.

7. The system of claim 6, wherein the controller is further configured to control each measurement circuit such that the frequency of the clock signal switches between zero and the second frequency value at a switching frequency of a third frequency value, the third frequency value being greater than the first frequency value and smaller than the second frequency value.

8. An impedance measurement device embedded within a chip, the impedance measurement device comprising:
    a measurement circuit coupled to a device under test (DUT), wherein the DUT comprises an electrical circuit, wherein the measurement circuit is configured to generate first voltage related data of the DUT;
    a fast Fourier transform (FFT) processor coupled to the measurement circuit, wherein the FFT processor is configured to convert the first voltage related data into second voltage related data using a fast Fourier transform; and
    a controller coupled to the measurement circuit and the FFT processor, wherein the controller is configured to calculate an impedance of the DUT using the second voltage related data and output the impedance calculated thereby for characterization of performance of the electrical circuit of the DUT.

9. The impedance measurement device of claim 8, wherein the DUT comprises a power mesh configured to be controlled by the first voltage related data and a clock tree configured to be controlled by a frequency of a clock signal generated by the measurement circuit.

10. The impedance measurement device of claim 9, wherein the FFT processor is further configured to convert first current related data that corresponds to current of the power mesh into second current related data.

11. The impedance measurement device of claim 10, wherein the controller is further configured to calculate a current amplitude using the second current related data.

12. The impedance measurement device of claim 9, wherein the measurement circuit is configured to detect a voltage of the power mesh.

13. The impedance measurement device of claim 8, wherein the controller is further configured to control the measurement circuit such that a frequency of a clock signal generated by the measurement circuit is equal to a first frequency value and a second frequency value at different times, the second frequency value being greater than the first frequency value.

14. The impedance measurement device of claim 13, wherein the controller is further configured to control the measurement circuit such that the frequency of the clock signal switches between zero and the second frequency value at a switching frequency of a third frequency value, the third frequency value being greater than the first frequency value and smaller than the second frequency value.

15. A method for determining impedance of a device under test (DUT) using an impedance measurement device embedded within a chip, the method comprising:
    generating, using a measurement circuit coupled to the DUT, first voltage related data for the DUT, wherein the DUT comprises an electrical circuit;
    converting, using a fast Fourier transform (FFT) processor coupled to the measurement circuit, the first voltage related data into second voltage related data using a fast Fourier transform;
    calculating, using a controller coupled to the measurement circuit and the FFT processor, an impedance of the DUT using the second voltage related data; and
    outputting, by the controller, the calculated impedance for characterization of performance of the electrical circuit of the DUT.

16. The method of claim 15, further comprising:
    controlling, by the first voltage related data, a power mesh of the DUT; and
    controlling, by a frequency of a clock signal generated by each measurement circuit, a clock tree of the DUT.

17. The method of claim 16, further comprising converting, using the FFT processor, first current related data that corresponds to current of the power mesh into second current related data.

18. The method of claim 17, further comprising calculating, by the controller, a current amplitude using the second current related data.

19. The method of claim 15, further comprising controlling, by the controller, the measurement circuit such that a frequency of a clock signal generated by each measurement circuit is equal to a first frequency value and a second frequency value at different times, the second frequency value being greater than the first frequency value.

20. The method of claim 19, further comprising controlling, by the controller, the measurement circuit such that the frequency of the clock signal switches between zero and second frequency value at a switching frequency of a third frequency value, the third frequency value being greater than the first frequency value and smaller than the second frequency value.

* * * * *